United States Patent
Besser et al.

(10) Patent No.: US 6,239,494 B1
(45) Date of Patent: May 29, 2001

(54) WIRE BONDING CU INTERCONNECTS

(75) Inventors: Paul R. Besser, Sunnyvale; Robin W. Cheung, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/295,357

(22) Filed: Apr. 21, 1999

(51) Int. Cl.$^7$ .................................................. H01L 23/48
(52) U.S. Cl. .................... 257/762; 257/700; 257/736; 257/748; 257/750; 257/758; 257/764; 257/765; 257/771; 257/890
(58) Field of Search .................................. 257/762, 700, 257/736, 748, 750, 758, 764, 765, 771, 890

(56) References Cited

U.S. PATENT DOCUMENTS

| | | | | |
|---|---|---|---|---|
| 4,505,029 | * | 3/1985 | Owyang et al. | 23/48 |
| 5,206,186 | * | 4/1993 | Wehgebauer et al. | 21/283 |
| 5,693,563 | | 12/1997 | Teong . | |
| 5,785,236 | | 7/1998 | Cheung et al. . | |

OTHER PUBLICATIONS

Eutectic Pb/Sn Solder Bump and Under Bump Metallurgy Interfacial Reactios and Adhesion, 1998/IEEE.*

* cited by examiner

Primary Examiner—Fetsum Abraham

(57) ABSTRACT

Wire bonding to a Cu interconnect via and Al pad with reduced Al and Cu inter-diffusion is achieved by interposing a barrier layer between the Cu interconnect and Al pad. Embodiments include forming a barrier layer of Ti, Ta, W, alloy thereof or nitride thereof, between the Cu interconnect and the Al pad.

19 Claims, 1 Drawing Sheet

WIRE BONDING CU INTERCONNECTS

TECHNICAL FIELD

The present invention relates to semiconductor devices comprising copper (Cu) and/or Cu alloy interconnection patterns. The present invention is applicable to manufacturing high speed integrated circuits having submicron design features and reliable high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, normally of doped monocrystalline silicon, and a plurality of sequentially formed inter-layer dielectrics and interconnected metallization layers defining conductive patterns An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different metallization layers, i.e., upper and lower metallization layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing an inter-layer dielectric on a conductive layer comprising at least one conductive pattern, forming an opening in the inter-layer dielectric by conventional photolithographic and etching techniques, and filling the opening with a conductive material, such as tungsten (W). Excess conductive material on the surface of the interdielectic layer is removed by chemical-mechanical polishing (CW). One such method is known as damascene and basically involves forming an opening and filling the opening with a metal. Dual damascene techniques involve forming an opening comprising a lower contact or via opening section in communication with an upper trench opening section, and filling the opening with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and the distance between interconnects decreases, the RC delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, e.g., about 0.15 micron and below, the rejection rate due to integrated circuit speed delays severely limits production throughput and significantly increases manufacturing costs. Moreover, as line widths decrease, electrical conductivity and electromigration resistance become increasingly important.

Cu and Cu alloys have received considerable attention as a replacement material for aluminum (Al) in ultra large scale interconnection metalizations. Cu is relatively inexpensive, easy to process, has a lower resistivity than Al, and has improved electrical properties vis-à-vis W, making Cu a desirable metal for use as a conductive plug as well as conductive wiring.

An approach to forming Cu plugs and wiring comprises the use of damascene structures employing CNO, as in Teong, U.S. Pat. No. 5,693,563. However, due to Cu diffusion through the interdielectic layer, Cu interconnect structures must be encapsulated by a diffusion barrier layer. Typical diffusion barrier metals include tantalum (Ta), tantalum nitride (TaN), titanium (Ti), titanium nitride (TiN), titanium-tungsten (TiW), and silicon nitride ($Si_3N_4$) for encapsulating Cu. The use of such barrier materials to encapsulate Cu is not limited to the interface between Cu and the interdielectric layer, but includes interfaces with other metals as well.

In forming Cu and/or Cu alloy interconnects, as by damascene metallization techniques, Cu will be exposed in the bonding pad area located on the top surface of the integrated circuit structure or uppermost metallization layer. The bonding pad area is the region where wires make contact with bonding pads to form electrical connection with the interconnects. In this case, where the Cu and/or Cu alloy interconnects are exposed in the bonding pad area, it is designed to be used as an interconnect and as a bonding pad.

Conventional techniques for wire bonding, however, are not compatible with bonding pads comprising Cu or a Cu alloy. Conventional technology employs bonding techniques, such as wedge bonding and ultrasonic bonding, etc., which require thermal agitation, i.e., rubbing the wire against the bonding pad to form a bond therebetween. Such conventional technology is suitable for bonding either gold (Au), Au alloy, Al or Al alloy wires to aluminum pads. However such conventional techniques are not suitable for bonding to Cu pads, since Cu is easily oxidized, form insulator.

In U.S. Pat. No. 5,785,236 issued to Cheung et al., methodology is disclosed for electrically connecting wires to a Cu interconnect by forming an intermediate Al pad on the Cu interconnect and bonding the wires to the Al pad. However, inter-diffusion of Cu and Al occurs between the Cu interconnect and the Al pad, thereby disadvantageously increasing the resistance of the interconnection system.

There exists a need for a reliable wire bonded Cu or Cu alloy interconnect structure. There also exists a need for methodology enabling wire bonding to a Cu or Cu alloy interconnect via an Al pad without Cu and Al inter-diffusion.

DISCLOSURE OF THE INVENTION

An advantage of the present invention is a semiconductor device comprising a Cu or Cu alloy interconnect structure with a reliable bond pad structure having high resistance to Cu and Al inter-diffusion.

Another advantage of the present invention is a method of manufacturing a semiconductor device comprising a Cu or Cu alloy interconnect structure with a reliable bonding pad structure having high resistance to Cu or Al diffusion.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising: a Cu or Cu alloy interconnect; a diffusion barrier layer on a surface of the Cu or Cu alloy interconnect; and an Al or Al alloy pad on the diffusion barrier layer.

Another aspect of the present invention is a method of manufacturing a semiconductor device, the method comprising: forming a Cu or Cu alloy interconnect; forming a diffusion barrier layer on a surface of the Cu or Cu alloy interconnect; and forming an Al or Al alloy pad on the diffusion barrier layer.

Embodiments of the present invention including forming a diffusion barrier layer of Ti, Ta, W, an alloy thereof or a nitride thereof, on an upper surface of a Cu or Cu alloy interconnect of an uppermost metallization layer, i.e., the wire bonding layer, forming the Al or Al alloy pad on the diffusion barrier layer and electrically connecting wires, e.g., Au, Au alloy, Al, Al alloy wires, to the Al or Al alloy pad on the Cu or Cu alloy interconnect.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1A:
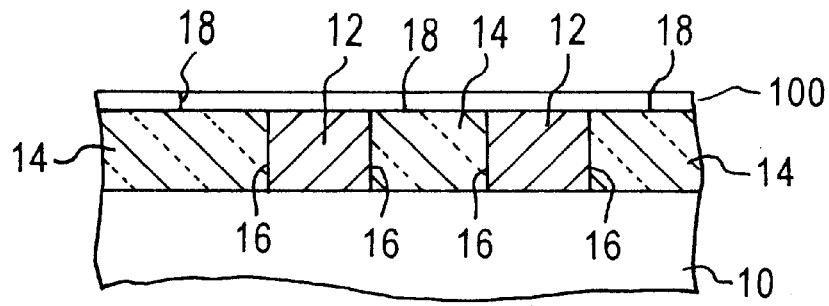
FIGS. 1A to 1D illustrate sequential phases of a method in accordance with embodiment of the present invention, wherein similar features are designated by similar reference numerals.

The present invention addresses and solves Cu and Al inter-diffusion problems attendant upon implementing the wire bonding technique disclosed in U.S. Pat. No. 5,785,236 (the '236 Patent) wherein an Al pad is formed on a Cu interconnect and the wires are bonded to the Al pad.

As employed throughout this application, the symbol Al is intended to encompass high purity elemental aluminum as well as aluminum-based alloys conventionally employed in manufacturing semiconductor devices, such as aluminum alloys containing minor amounts of Cu and tin (Sn). As also employed throughout this application, the symbol Cu is intended to encompass high purity elemental copper as well as copper-based alloys, such as Cu alloys containing minor amounts of zinc (Zn), manganese, (Mn), titanium (Ti) and germanium (Ge). The symbol Au is intended to encompass high purity elemental gold as well as gold-based alloys conventionally employed in manufacturing semiconductor devices.

In accordance with the present invention, Cu and Al diffusion problems attendant upon implementing the wire bonding technique disclosed in the '236 Patent are eliminated or substantially reduced by forming a diffusion barrier layer between the Cu interconnect and Al pad. The interposition of a diffusion barrier layer between the Cu interconnect and Al pad provides high resistance to Cu and Al inter-diffusion, thereby minimizing resistivity.

Embodiments of the present invention comprise forming a diffusion barrier layer comprising Ti, Ta, W, an alloy thereof or a nitride thereof on an exposed surface of a Cu interconnect and forming the Al pad on the diffusion barrier layer. The diffusion barrier layer can be formed at a suitable thickness to prevent Cu and Al inter-diffusion, e.g., about 200 Å to about 5,000 ÅA. The diffusion barrier layer can be deposited in any suitable manner, as by physical vapor deposition, e.g., sputtering.

Embodiments of the present invention include forming a multi-layer semiconductor device comprising a plurality of Cu metallization layers stacked above a semiconductor substrate, with an inter-layer dielectric separating two metallization layers. The metallization layers define conductive patterns which can be formed by conventional metal deposition and etch back techniques or by conventional damascene techniques. The uppermost metallization layer, typically referred to as the bonding pad layer, contains the Cu interconnect to which wires are electrically connected employing the Al pad wire bonding techniques of the '236 Patent, with the inventive improvement disclosed herein comprising the interposition of a diffusion barrier layer between the Cu interconnect and Al pad.

Embodiments of the present invention comprise forming damascene openings in an inter-layer dielectric, depositing a diffusion barrier layer lining the openings, depositing a layer of Cu filling the openings and CMT to form the metallization layer, including the uppermost metallization layer containing the Cu interconnect for wire bonding. The diffusion barrier layer is then formed on the exposed Cu interconnect and the Al pad wire bonding technique of the '236 Patent implemented.

An embodiment of the method in accordance with the present invention is schematically illustrated in FIGS. 1A–1D, wherein similar reference numerals designate similar elements. Adverting to FIG. 1A, an integrated circuit structure 10 is formed containing Cu interconnects 12 formed thereon. The integrated circuit structure 10 may comprise a semiconductor substrate having integrated circuits devices formed therein, such as doped regions in the semiconductor substrate separated by a field oxide. The integrated circuit structure 10 may also comprise a multi-layer interconnection structure formed over the semiconductor substrate connecting the integrated circuit devices, such as multi Cu metallization layers, each layer supported above and spaced apart from the metallization layer below by an inter-layer dielectric.

The Cu interconnects 12 illustrated in FIG. 1A are formed in an inter-layer dielectric 14, as by a conventional damascene technique or by back etching followed by gap filling. Although two Cu interconnects 12 are illustrated, it should be readily apparent that any number of Cu interconnects can be formed in inter-layer dielectric 14. The inter-layer dielectric 14 can comprise any suitable dielectric material, such as an oxide, e.g., a CVD oxide, silicon dioxide, or fluorinated silicon dioxide, a nitride, such as silicon nitride, an oxynitride, such as a silicon oxynitride, a polymer, such as benzocylobutene, or spin-on glass. Typically in damascene processing, the inter-layer dielectric 14 is sequentially patterned and etched to form openings or trenches 16 therein, which are filled in by blanket Cu deposition followed by polishing, as by CMT, to remove Cu from the surface 18 of the inter-layer dielectric 14 such that the upper surface of Cu interconnects 12 are substantially coplanar with the upper surface 18 of the inter-layer dielectric 14.

In accordance with the present invention, a diffusion barrier layer 100 is deposited on the planarized surface, as by sputtering. The diffusion barrier layer can comprise a material suitable for preventing diffusion of Cu and Al, such as Ti, Ta, W, an alloy thereof or a nitride thereof.

Figure 1B:
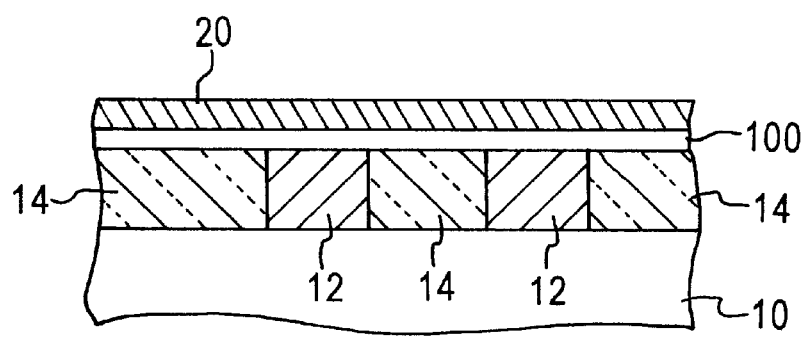
Figure 1C:
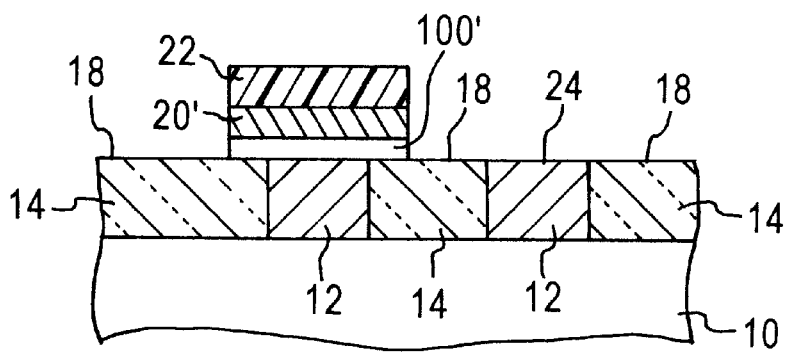

Subsequently, as shown in FIG. 1B, a layer of Al 20, with or without an optional barrier metal layer (not shown), are deposited by conventional techniques. The Al layer 20 is formed on the diffusion barrier layer 100. Subsequently, patterning and etching is conducted in a conventional manner, as by employing a negative tone pad mask, e.g., resist pattern 22 illustrated in FIG. 1C. Reactive ion etching is then conducted to pattern the Al layer thereby forming at least one Al pad 20' as shown in FIG. 1C overlying patterned diffusion barrier layer 100. Although one Al pad 20' is illustrated in FIG. 1C, it should be readily apparent that any number of such Al pads can be formed.

Figure 1D:
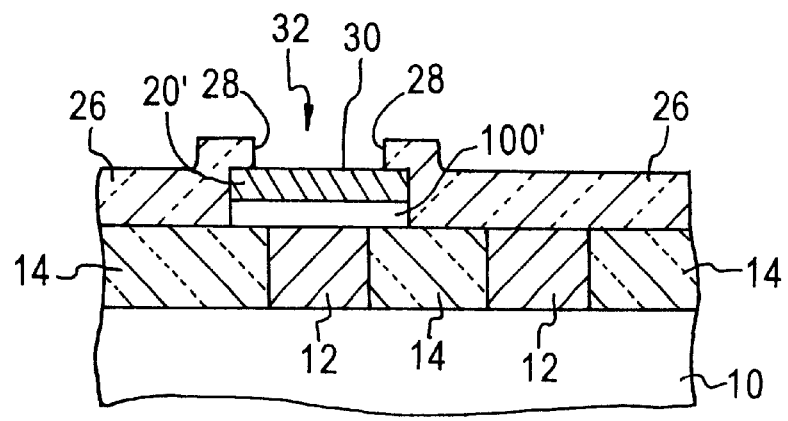

As illustrated in FIG. 1D, an insulating layer or passivation layer 26 is formed on the Al pad 20'. Passivation layer 26 is patterned and etched in a conventional manner to form a bonding pad opening 28 as illustrated in FIG. 1D. The bonding pad opening 28 exposes the surface 30 of the Al pad 20'. Although only one bonding pad opening 28 is depicted, it should be readily apparent that any number of such bonding pad openings can be formed in passivation layer 26.

In this manner, at least one bonding pad area 32 is formed, such as the pad opening area illustrated in FIG. 1D. The pad opening area 32 comprises the bonding pad opening 28 and the surface 30 of the Al pad 20'.

Once Al pad 20' and the bonding pad opening have been formed, conventional techniques can be implemented to bond a metal wire to the Al pad. Aluminum oxide may exist on the surface 30 of the Al pad 20'. Conventional bonding techniques comprise removing the aluminum oxide on the surface 30 of the Al pad 20 and forming a good ohmic contact with the metal wire. Typically, Au, Au alloys, Al and/or Al alloys are employed for the metal wires. The integrated circuit can be packaged in a plastic package or in a hermetic package. Typically, Au and Au alloy wires are employed for plastic packages, while Al and Al alloy wires are employed for hermetic packages.

In various embodiments of the present invention, conventional substrates and inter-layer dielectrics can be employed. For example, the substrate can be doped monocrystalline silicon or gallium-arsenide. The inter-layer dielectric employed in the present invention can comprise any dielectric material conventionally employed in the manufacture of semiconductor devices. For example, dielectric materials such as silicon dioxide, phospho-silicate-glass (PSG), boron doped PSG (BPSG), and silicon dioxide derived from tetraethylorthosilicate (TEOS) or silane by PECVD can be employed. Inter-layer dielectrics in accordance with the present invention can also comprise low dielectric constant materials, including polymers, such as polyamides. The opening formed in dielectric layers are effected by conventional photolithographic and etching techniques. The damascene openings encompassed by the present invention are not confined to dual damascene openings but encompass single damascene via/contact openings and trenches.

the present invention enables the effective electrical connection of wires to a Cu interconnect via an Al pad with high integrity, reduced Cu and Al inter-diffusion, improved electromigration resistance increased operating speed and improved reliability. The present invention enjoys industrial applicability in forming various types of inlaid Cu interconnection patterns. The present invention is particularly applicable in manufacturing high density semiconductor devices with high speed circuitry, submicron features and high aspect ratio openings, e.g., semiconductor devices with a design rule of about 0.18 micron and under, e.g., about 0.15 micron and under.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A semiconductor device comprising:
    a copper (Cu) or Cu alloy interconnect formed in an inter-layer dielectric;
    a diffusion barrier layer on a surface of the Cu or Cu alloy interconnect;
    and an aluminum (Al) or Al alloy pad on the diffusion barrier layer.

2. The semiconductor device according to claim 1, further comprising at least one wire bonded to the Al or Al alloy pad.

3. The semiconductor device according to claim 2, wherein at least one wire comprises gold, an alloy of gold, Al and/or an Al alloy.

4. The semiconductor device according to claim 2, wherein the diffusion barrier layer comprises titanium, tantalum, tungsten, an alloy thereof or a nitride thereof.

5. The semiconductor device according to claim 4, wherein the diffusion barrier layer has a thickness of about 200 Å to about 5,000 Å.

6. The semiconductor device according to claim 4, wherein the diffusion barrier layer comprises tantalum, tungsten, an alloy or a nitride thereof.

7. The semiconductor device according to claim 2, further comprising a dielectric layer covering a portion an upper surface of the Al or Al alloy pad.

8. The semiconductor according to claim 2, comprising a plurality of stacked metalization layers with an inter-layer dielectric between each metallization layer formed over a substrate, wherein the Cu or Cu alloy interconnect is in the uppermost metallization layer.

9. A method of manufacturing a semiconductor device, the method comprising:
    forming a copper (Cu) or Cu alloy interconnect in an inter-layer dielectric;
    forming a diffusion barrier layer on a surface of the Cu or Cu alloy interconnect and
    forming an aluminum (Al) or Al alloy pad on the diffusion barrier layer.

10. The method according to claim 9, further comprising bonding at least one wire to the Al or Al alloy pad.

11. The method according to claim 10, wherein the at least one wire comprises a gold, gold alloy, Al and/or Al alloy wire.

12. The method according to claim 9, comprising forming a layer of titanium, tantalum, tungsten, an alloy thereof or nitride thereof as the diffusion barrier layer.

13. The method according to claim 10, comprising forming the diffusion barrier layer at a thickness of about 200 Å to about 5,000 Å.

14. The method according to claim 10, comprising forming a plurality of stacked metallization layers with an inter-layer dielectric between each metallization layer over a substrate, wherein the Cu or Cu alloy interconnect is in the uppermost metallization layer.

15. The method according to claim 14, further comprising forming a dielectric layer over a portion of the Al or Al alloy pad before wire bonding.

16. The method according to claim 14, comprising:

depositing an inter-layer dielectric;

forming damascene openings in the inter-layer dielectric;

filling the openings with Cu or a Cu alloy; and planarizing to form the uppermost metallization pattern including the Cu or Cu alloy interconnect.

17. The method according to claim 16, further comprising depositing a diffusion barrier layer lining the openings before filling the openings.

18. The method according to claim 17, comprising depositing a layer of titanium, tantalum, tungsten an alloy thereof or a nitride thereof, as the diffusion barrier layer lining the openings.

19. The method according to claim 11, wherein the diffusion barrier layer comprises tantalum, tungsten, an alloy or a nitride thereof.

* * * * *